(12) United States Patent
Kim et al.

(10) Patent No.: US 8,305,221 B2
(45) Date of Patent: Nov. 6, 2012

(54) PROGRAMMABLE MIT SENSOR USING THE ABRUPT MIT DEVICE, AND ALARM APPARATUS AND SECONDARY BATTERY ANTI-EXPLOSION CIRCUIT INCLUDING THE MIT SENSOR

(75) Inventors: Hyun-Tak Kim, Daejeon (KR);
Bong-Jun Kim, Daejeon (KR);
Byung-Gyu Chae, Daejeon (KR);
Sun-Jin Yun, Daejeon (KR); Sung-Youl Choi, Ulsan (KR); Yong-Wook Lee, Daejeon (KR); JungWook Lim, Daejeon (KR); Sang-Kuk Choi, Daejeon (KR); Kwang-Yong Kang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 814 days.

(21) Appl. No.: 12/303,000

(22) PCT Filed: May 30, 2007

(86) PCT No.: PCT/KR2007/002614
§ 371 (c)(1),
(2), (4) Date: Jun. 15, 2009

(87) PCT Pub. No.: WO2007/142423
PCT Pub. Date: Dec. 13, 2007

(65) Prior Publication Data
US 2009/0315724 A1    Dec. 24, 2009

(30) Foreign Application Priority Data

Jun. 2, 2006 (KR) .................. 10-2006-0050032
Dec. 8, 2006 (KR) .................. 10-2006-0125063

(51) Int. Cl.
*G08B 17/00* (2006.01)

(52) U.S. Cl. ........ 340/584; 340/585; 340/588; 327/509; 257/E29.255; 257/414; 429/61

(58) Field of Classification Search .......... 340/584–589, 340/596, 635, 870.17; 327/509; 257/E29.255, 257/414; 429/61
See application file for complete search history.

(56) References Cited

U.S. PATENT DOCUMENTS 5,677,634 A * 10/1997 Cooke et al. .................. 324/548
(Continued)

FOREIGN PATENT DOCUMENTS
JP          62-124756 A     6/1987
(Continued)

OTHER PUBLICATIONS

Hyun-Tak Kim et al., "Mechanism and observation of Mott transition in $VO_2$-based two- and three-terminal devices", New Journal of Physics 6, 2004, pp. 2-21.
(Continued)

*Primary Examiner* — Eric M Blount
(74) *Attorney, Agent, or Firm* — Rabin & Berdo, P.C.

(57) ABSTRACT

Provided are an abrupt MIT device with variable MIT temperature or voltage, an MIT sensor using the abrupt MIT device, and an alarm apparatus and a secondary battery anti-explosion circuit including the MIT sensor. The MIT device includes an abrupt MIT layer undergoing an abrupt MIT at a transition temperature or a transition voltage and at least two electrode layers contacting the abrupt MIT layer. The transition temperature or the transition voltage varies with at least one of factors including a voltage applied to the electrode layers, a temperature, an electromagnetic wave, a pressure, and a gas concentration that affect the abrupt MIT layer. The MIT sensor is a temperature sensor, an infrared sensor, an image sensor, a pressure sensor, a gas-concentration sensor, or a switch. The alarm apparatus includes the MIT sensor and an alarm-signaling unit connected in series with the MIT sensor. The secondary battery anti-explosion circuit includes a secondary battery, the MIT sensor attached to the secondary battery to sense the temperature of the secondary battery and thus to prevent the possible explosion of the secondary battery, and a protection circuit body powered by the secondary battery.

26 Claims, 11 Drawing Sheets

U.S. PATENT DOCUMENTS

| | | | |
|---|---|---|---|
| 6,092,926 A * | 7/2000 | Still et al. | 374/141 |
| 6,121,642 A | 9/2000 | Newns | |
| 6,365,913 B1 | 4/2002 | Misewich et al. | |
| 6,466,132 B1 * | 10/2002 | Caronna et al. | 340/584 |
| 6,624,463 B2 * | 9/2003 | Kim et al. | 257/310 |
| 6,987,290 B2 | 1/2006 | Kim et al. | |
| 2006/0043935 A1 | 3/2006 | Chang et al. | |
| 2007/0072060 A1 * | 3/2007 | Chang et al. | 429/62 |
| 2008/0297358 A1 * | 12/2008 | Kim et al. | 340/595 |
| 2010/0182034 A1 * | 7/2010 | Kim et al. | 324/765 |

FOREIGN PATENT DOCUMENTS

| | | |
|---|---|---|
| JP | 6-058821 A | 3/1994 |
| JP | 6-044109 A | 11/1994 |
| JP | 2004-172164 A | 6/2004 |
| JP | 2005-311363 A | 11/2005 |
| JP | 2006-032898 A | 2/2006 |
| KR | 1020050043431 | 11/2003 |
| KR | 1020060006195 | 1/2006 |
| KR | 1020060064461 | 6/2006 |
| WO | WO-2005/078399 A1 | 8/2005 |

OTHER PUBLICATIONS

Hidekazu Tanaka, et al., Extended Abstracts (The 48$^{th}$ Spring Meeeting, 2001); The Japan Society of Applied Physics and Related Societies, No. 1, 2001, pp. 2-5.

* cited by examiner

PROGRAMMABLE MIT SENSOR USING THE ABRUPT MIT DEVICE, AND ALARM APPARATUS AND SECONDARY BATTERY ANTI-EXPLOSION CIRCUIT INCLUDING THE MIT SENSOR

TECHNICAL FIELD

The present invention relates to a sensor and an alarm apparatus, and more particularly, to an abrupt metal-insulator transition (MIT) device which undergoes an abrupt MIT at a transition temperature or voltage, an MIT sensor (e.g. a temperature sensor, a pressure sensor, or a chemical gas concentration sensor) using the abrupt MIT device, and an alarm apparatus and a secondary battery anti-explosion circuit including the MIT sensor. The programmable MIT sensor indicates that the MIT transition temperature or the MIT transition voltage is programmatically controlled.

BACKGROUND ART

Accurately measuring and controlling temperature is very important throughout industry. Temperature sensors are at the heart of all temperature control systems, and usually use thermistors as a sensing element since they are cheap and convenient.

A thermistor is a semiconductor with suitable resistivity and temperature coefficient, which is fabricated by mixing oxides of Co, Mn, Fe, Ni, Ti, etc. and then sintering the mixture. The conductivity of a thermistor changes with temperature. Unlike general metals, a thermistor has a negative temperature coefficient (NTC), meaning its resistance decreases as temperature increases. NTC thermistors are widely used in devices that sense temperature.

FIG. 1 is a circuit diagram of a conventional alarm apparatus using a thermistor.

Referring to FIG. 1, the conventional alarm apparatus includes a sensor unit (denoted by a dotted-line rectangle) and an alarm-signaling unit. The sensor unit includes a thermistor 10, an amplifier 20, and a transistor 30. The alarm-signaling unit includes a buzzer 50 and a light-emitting diode 60. The sensor unit and the alarm-signaling unit are connected through a relay switch 40.

As the resistance of the thermistor 10 changes with temperature, the voltage at a negative input terminal of the amplifier 20 changes and thus the output voltage of the amplifier 20 changes. The output voltage of the amplifier 20 is applied to a base terminal of the transistor 30. The transistor 30 is turned on when the applied output voltage reaches a specific voltage. Accordingly, the relay switch 40 is also turned on, to operate the buzzer 50 and the light-emitting diode 60.

The conventional alarm apparatus using a thermistor is widely used, but is complex because it includes an amplifier, a transistor, and a plurality of resistors, as illustrated in FIG. 1. In addition, the temperature threshold of the conventional alarm apparatus is fixed at a specific temperature, specified by the resistance change rate of the thermistor.

Another example of a temperature sensor is a bimetal temperature sensor. The bimetal temperature sensor is also inexpensive and widely used, but has a very wide range of temperature thresholds, and thus is difficult to use for accurately sensing a desired temperature.

A further example of a temperature sensor is a ceramic temperature sensor using vanadium dioxide ($VO_2$). The vanadium dioxide undergoes a structural phase transition from a monoclinic system to a tetragonal system at a critical temperature of about 68° C., and thus changes in electrical resistance. However, this critical temperature is not adjustable, and the ceramic temperature sensor is easily broken down by a large current.

DISCLOSURE OF INVENTION

Technical Problem

The present invention provides an abrupt MIT device with variable transition temperature or voltage, an MIT sensor capable of sensing temperature, pressures and chemical gas concentration using the abrupt MIT device, and an alarm apparatus and a secondary battery anti-explosion circuit including the MIT sensor.

Technical Solution

According to an aspect of the present invention, there is provided an abrupt MIT device including: an abrupt MIT layer undergoing an abrupt MIT at a transition temperature or a transition voltage; and at least two electrode layers contacting the abrupt MIT layer, wherein the transition temperature or the transition voltage varies with at least one of factors including a voltage applied to the electrode layers, a temperature, an electromagnetic wave, a pressure, and a gas concentration that affect the abrupt MIT layer.

The two electrode layers may be vertically stacked with the abrupt MIT layer interposed therebetween, or the two electrode layers may be formed respectively on both ends of the abrupt MIT layer.

The abrupt MIT layer may be formed of at least one of an inorganic compound semiconductor or insulator material to which low-concentration holes are added, an organic semiconductor or insulator material to which low-concentration holes are added, a semiconductor material to which low-concentration holes are added, and an oxide semiconductor or insulator material to which low-concentration holes are added, the inorganic compound semiconductor or insulator material, the organic semiconductor or insulator material, the semiconductor material, and the oxide semiconductor or insulator material including at least one of oxygen, carbon, a semiconductor element (e.g. a group III-V compound or a group II-VI compound), a transition metal element, a rare earth element, and a lanthanum-based element. For example, the abrupt MIT layer may be formed of vanadium dioxide ($VO_2$) or gallium arsenide (GaAs) doped with low-concentration holes.

The electromagnetic wave may include infrared rays, and the transition temperature or the transition voltage may be varied by irradiation of the electromagnetic wave onto the abrupt MIT layer. The abrupt MIT device may be used in at least one of a temperature sensor, an infrared sensor, an image sensor, a pressure sensor, a gas-concentration sensor, and a switch.

According to another aspect of the present invention, there is provided an MIT sensor fabricated using the above abrupt MIT device.

The MIT sensor may be at least one of a temperature sensor, an electromagnetic wave detector, an infrared sensor, an image sensor, a pressure sensor, a gas-concentration sensor, a particle detector (electron, ion, cosmic ray), and a switch. The abrupt MIT device may be connected in parallel and/or in series with like devices (arrayed sensor), or the abrupt MIT device may be arranged in an array or matrix configuration with like devices (arrayed sensor).

The abrupt MIT layer and the electrode layers may be hermetically sealed with sealant to form a DIP-type abrupt MIT device, a CAN-type abrupt MIT device or a portion of the abrupt MIT layer may be opened to form a CAN-type abrupt MIT device. The abrupt MIT device may be fabricated as the CAN type and a lens may be formed at an opening portion of the CAN-type abrupt MIT device to condense electromagnetic waves onto the abrupt MIT layer. The electromagnetic waves may be irradiated onto the abrupt MIT layer to vary the transition temperature or the transition voltage of the abrupt MIT device.

The MIT sensor may be electrically connected to an alarm-signaling unit directly or through a relay switch to sense at least one of a temperature, a pressure, a gas concentration, a particle, and an electromagnetic wave strength, and an alarm signal may be generated by the alarm-signaling unit when the sensed value is equal to or greater than a reference value. The gas concentration may be a concentration of gas including at least one of oxygen, carbon, hydrogen, nitrogen, chlorine, and sulfur.

The MIT sensor may further include a heat sink dissipating the heat of the abrupt MIT layer outside. The MIT sensor may further include a variable resistor connected in series with the abrupt MIT device to adjust a voltage applied to the abrupt MIT device.

According to another aspect of the present invention, there is provided an alarm apparatus including: the above MIT sensor; and an alarm-signaling unit connected in series to the MIT sensor.

The MIT sensor may be at least one of a temperature sensor, an electromagnetic wave detector, an image sensor, a pressure sensor, a gas-concentration sensor, and a switch. The electromagnetic wave may include infrared, visible, ultraviolet, X-ray, The transition temperature or the transition voltage may be varied by irradiation of the electromagnetic wave onto the abrupt MIT layer (Programmable).

The abrupt MIT device may be connected in parallel and/or in series with like devices (arrayed sensor), or the abrupt MIT device may be arranged in an array or matrix configuration with like devices (arrayed sensor). The MIT sensor may sense an electromagnetic wave including infrared rays through the array or matrix configuration to send an alarm signal including an image signal to the alarm-signaling unit.

According to another aspect of the present invention, there is provided a secondary battery anti-explosion circuit including: a secondary battery; the above MIT sensor, attached to the secondary battery to sense the temperature of the secondary battery and thus prevent the possible explosion of the secondary battery; and a protection circuit body powered by the secondary battery.

One terminal of the secondary battery may be connected to the first electrode layer of the abrupt MIT device of the MIT sensor, to a first terminal of a 4-terminal relay switch, and to one terminal of the protection circuit body, the other terminal of the secondary battery may be connected to second and third terminals of the relay switch and to the other terminal of the protection circuit body, the second electrode layer of the abrupt MIT device may be connected to a fourth terminal of the relay switch, and the abrupt MIT device may undergo an abrupt MIT due to a temperature rise in the secondary battery, an abrupt current change may occur between the third and fourth terminals of the relay switch, and the first and second terminals of the relay switch may be turned on by the abrupt current change to prevent the possible explosion of the secondary battery.

A variable resistor may be connected between one terminal of the secondary battery and the first electrode layer of the abrupt MIT device to change the transition temperature of the abrupt MIT device or to protect the abrupt MIT device, and a relay resistor may be connected between one terminal of the secondary battery and the first terminal of the relay switch to prevent an electrical short of the secondary battery anti-explosion circuit. An overcurrent prevention device (e.g. a positive temperature coefficient thermistor (PTC)) may be connected between one terminal of the secondary battery and one terminal of the protection circuit body.

The relay switch may be connected in series with the secondary battery and the protection circuit body, and the MIT device or sensor operating the relay switch may be attached to the secondary battery. Transistors may be used instead of the relay switch. The transistors may be connected in series between the secondary battery and the protection circuit body in such a way that they are suitably oriented for the charge/discharge operation of the secondary battery.

Advantageous Effects

The abrupt MIT devices of the present invention makes it possible to vary the transition temperature by changing an applied voltage or electromagnetic field.

Also, the abrupt MIT devices of the present invention can be used to implement a variety of sensors such as temperature sensors, magnetic-field sensors, image sensors, electromagnetic-wave sensors, pressure sensors, and gas-concentration sensors.

Also, the use of such temperature sensors makes it possible to fabricate a small, low-cost alarm apparatus with variable sensing temperature.

Also, the MIT sensor of the present invention can be attached to a secondary battery to implement the secondary battery anti-explosion circuit and prevent the secondary battery from exploding due to an excessive temperature rise.

DESCRIPTION OF DRAWINGS

The above and other features and advantages of the present invention will become more apparent by describing in detail exemplary embodiments thereof with reference to the attached drawings in which.

BEST MODE

Figure 1:
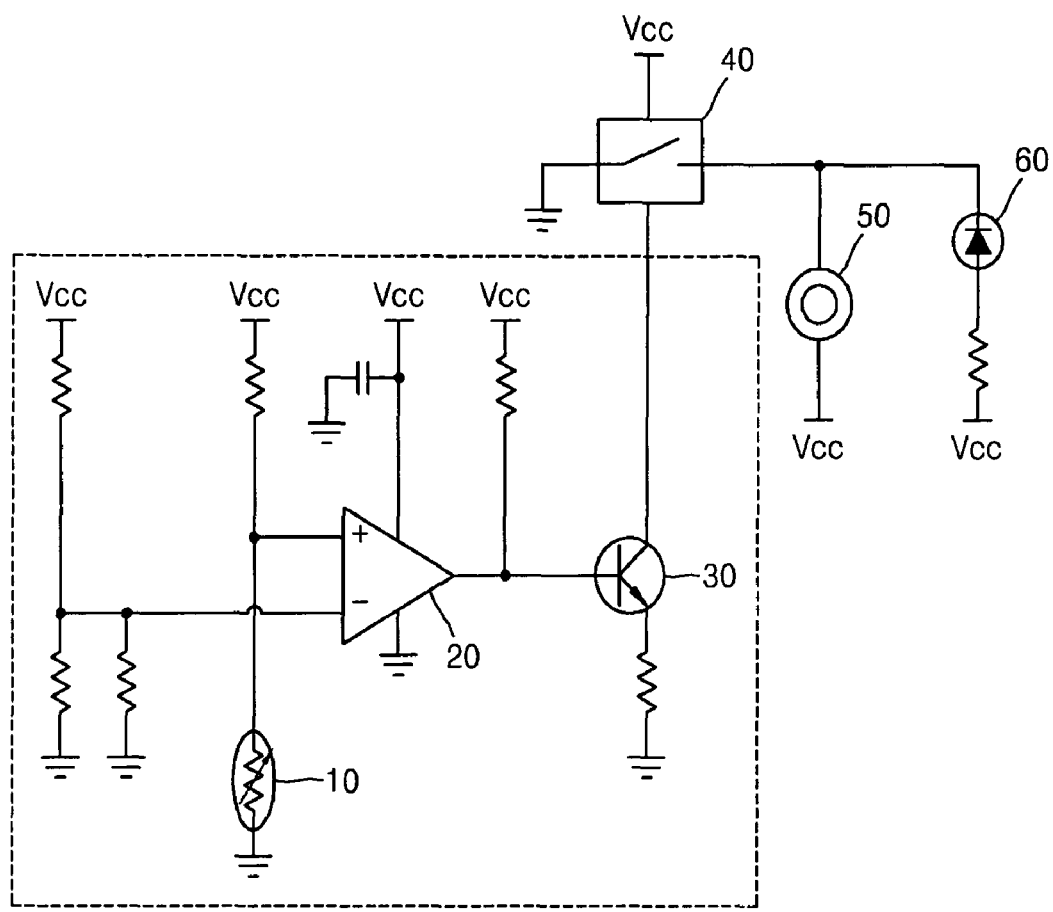
FIG. 1 is a circuit diagram of a conventional alarm apparatus using a thermistor.

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being 'on' another layer or substrate, it can be directly on the other layer or substrate, or intervening layers may also be present. Like reference numerals denote like elements in the drawings, and thus their description will not be repeated.

The present invention is intended to provide an abrupt MIT (metal-insulator transition) device that undergoes an abrupt MIT at specific temperatures. These specific temperatures will be referred to as 'transition temperatures' or 'MIT temperatures'. In particular, the present invention is intended to provide an abrupt MIT device with variable MIT temperatures, a temperature sensor using the abrupt MIT device, and an alarm apparatus including the temperature sensor.

The abrupt MIT device includes an abrupt MIT layer and at least two electrode layers. Depending on the locations of the abrupt MIT layer and the electrode layers, the abrupt MIT device may have a stack-type (or vertical-type) structure or a planar-type structure.

Figure 2:
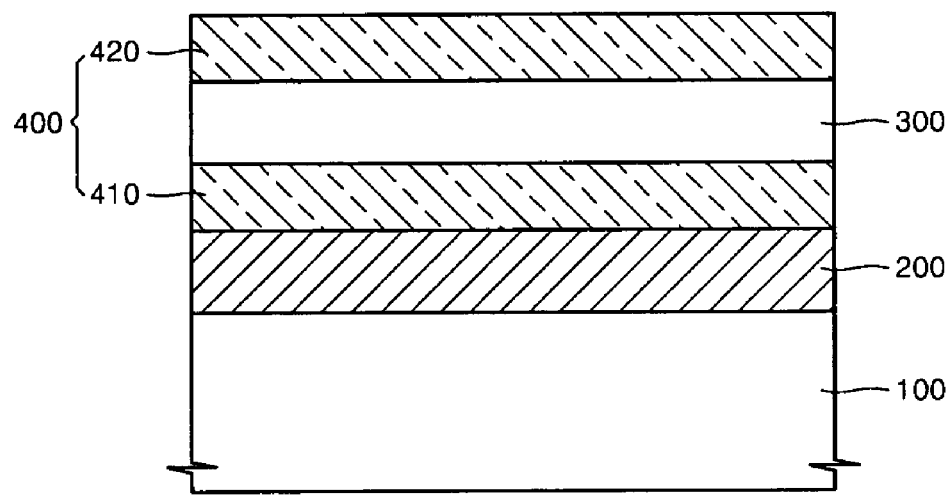
FIG. 2 a sectional view of a stack-type abrupt MIT device according to an embodiment of the present invention.

FIG. 2 is a sectional view of a stack-type abrupt MIT device according to an embodiment of the present invention.

Referring to FIG. 2, the stack-type abrupt MIT device includes a substrate 100, a buffer layer 200, a first electrode layer 410, an abrupt MIT layer 300, and a second electrode layer 420. The buffer layer 200 is formed on the substrate 100 and the first electrode layer 410 is formed on the buffer layer 200. The abrupt MIT layer 300 is formed on the first electrode layer 410, and the second electrode layer 420 is formed on the abrupt MIT layer 300. The first electrode layer 410 and the second electrode layer 420 constitute an electrode layer 400.

The buffer layer 200 serves to reduce a lattice mismatch between the substrate 100 and the first electrode layer 410. If the lattice mismatch between the substrate 100 and the first electrode layer 410 is very small, the first electrode layer 410 may be formed directly on the substrate 100 with no buffer layer. The buffer layer 200 may include an $SiO_2$ layer or an $Si_3N_4$ layer.

The abrupt MIT layer 300 may be formed of at least one of an inorganic compound semiconductor or insulator material to which low-concentration holes are added, an organic semiconductor or insulator material to which low-concentration holes are added, a semiconductor material to which low-concentration holes are added, and an oxide semiconductor or insulator material to which low-concentration holes are added. The inorganic compound semiconductor or insulator material, the organic semiconductor or insulator material, the semiconductor material, and the oxide semiconductor or insulator material may include at least one of oxygen, carbon, a semiconductor element (e.g. a group III-V compound or a group II-VI compound), a transition metal element, a rare earth element, and a lanthanum-based element. Alternatively, the abrupt MIT layer 300 may include an n-type semiconductor or insulator with a very high resistance. The concentration of the added holes may be about $3 \times 10^{16}$ cm$^{-3}$.

The electrode layer 400 may be formed of at least one of W, Mo, W/Au, Mo/Au, Cr/Au, Ti/W, Ti/Al/N, Ni/Cr, Al/Au, Pt, Cr/Mo/Au, $YBa_2Cu_3O_{7-d}$, Ni/Au, Ni/Mo, Ni/Mo/Au, Ni/Mo/Ag, Ni/Mo/Al, Ni/W, Ni/W/Au, Ni/W/Ag, and Ni/W/Al. This electrode layer 400 may be formed using at least one of sputtering deposition, vacuum deposition, and electron-beam (E-beam) deposition.

The substrate 100 may be formed of at least one of Si, $SiO_2$, GaAs, $Al_2O_3$ plastic, glass, $V_2O_5$, $PrBa_2Cu_3O_7$, $YBa_2Cu_3O_7$, MgO, $SrTiO_3$, SrTiO3 doped with Nb, and silicon-on-insulator (SOI).

The electrical characteristics of the abrupt MIT device according to the present invention change abruptly with temperature. That is, the abrupt MIT device exhibits insulative characteristics at temperatures below the transition temperature but exhibits metallic characteristics at temperatures equal to or higher than the transition temperature.

Figure 3A:
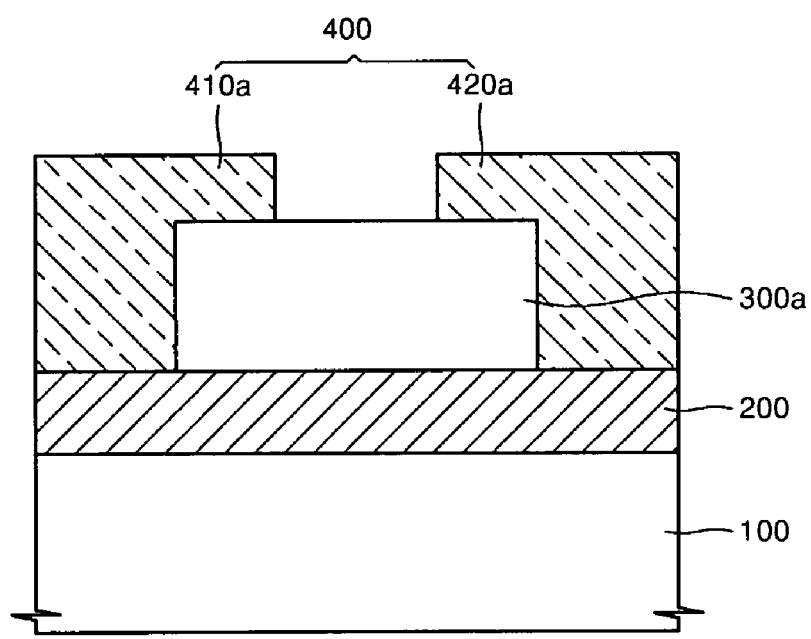
FIG. 3A is a sectional view of a planar-type abrupt MIT device according to an embodiment of the present invention.

FIG. 3A is a sectional view of a planar-type abrupt MIT device according to an embodiment of the present invention.

Referring to FIG. 3A, the planar-type abrupt MIT device includes a substrate 100, a buffer layer 200, an abrupt MIT layer 300a, a first electrode layer 410a, and a second electrode layer 420a. The buffer layer 200 is formed on the substrate 100 and the abrupt MIT layer 300a is formed on a center portion of the top surface of the buffer layer 200. The first electrode layer 410a and the second electrode layer 420a are formed on the buffer layer 200 and on the side and top surfaces of the abrupt MIT layer 300a in such a way that they are spaced apart from and face each other with the abrupt MIT layer 300a interposed therebetween. The first electrode layer 410a and the second electrode layer 420a constitute an electrode layer 400.

The buffer layer 200 serves to reduce a lattice mismatch between the abrupt MIT layer 300a and the substrate 100. If the lattice mismatch between the substrate 100 and the abrupt MIT layer 300a is very small, the abrupt MIT layer 300a may be formed directly on the substrate 100 with no buffer layer.

The substrate 100, the buffer layer 200, the abrupt MIT layer 300a, and the electrode layer 400 may be formed of the same materials as those in FIG. 2. The stack-type abrupt MIT device and the planar-type abrupt MIT device can be fabricated very cheaply and in very small sizes down to micrometer scale.

Figure 3B:
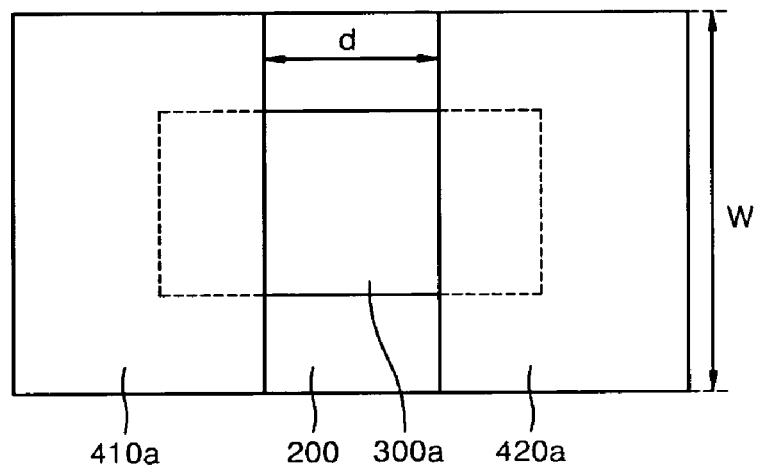
FIG. 3B is a plan view of the planar-type abrupt MIT device illustrated in FIG. 3A.

FIG. 3B is a plan view of the planar-type abrupt MIT device illustrated in FIG. 3A, showing the buffer layer 200, the abrupt MIT layer 300a, the first electrode layer 410a, and the second electrode layer 420a. In general, an abrupt MIT device undergoes an abrupt MIT at a specific voltage (referred to as a 'transition voltage'), which may vary with the structure of the components of the abrupt MIT device. For example, the distance d between the first electrode layer 410a and the second electrode layer 420a or the width w of the electrode layer may be changed to vary the transition voltage and temperature of the planar-type abrupt MIT device. This will be described later in detail with reference to FIGS. 6 through 8.

Figure 4:
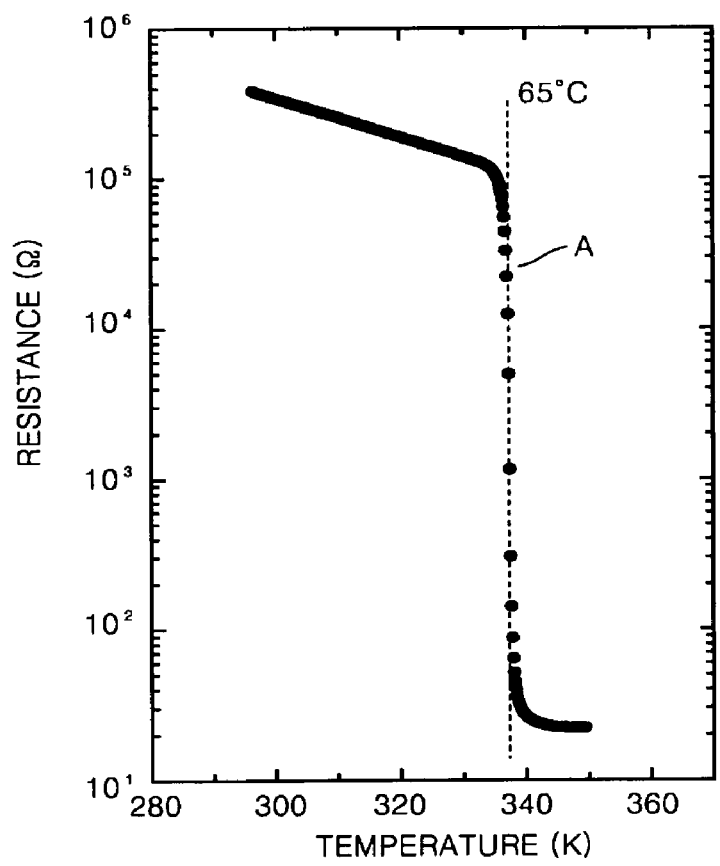
FIG. 4 is a temperature-resistance graph of an experimental temperature sensor using an abrupt MIT device fabricated using vanadium dioxide ($VO_2$) that undergoes an abrupt MIT at a transition temperature.

FIG. 4 is a temperature-resistance graph of an experimental temperature sensor using an abrupt MIT device fabricated using vanadium dioxide ($VO_2$) that undergoes an abrupt MIT at a transition temperature.

Referring to FIG. 4, the abscissa axis denotes absolute temperature (K) and the ordinate axis denotes resistance (Ω). At absolute temperatures below about 338 K (i.e. about 65° C. (A)), the temperature sensor has a high resistance of $10^5 Ω$ or more and exhibits near-insulative characteristics. Above this temperature, the resistance of the temperature sensor decreases abruptly to several tens of Ω, exhibiting metallic characteristics. The reason for the abrupt resistance change of the temperature sensor is that the abrupt MIT device undergoes an abrupt MIT at about 65° C. That is, the abrupt MIT device used as the temperature sensor in this experiment has a transition temperature of about 65° C.

The transition temperature of the temperature sensor fabricated using $VO_2$ may be changed by using suitable dopants or by changing the materials or structures of components of the abrupt MIT device. In this way, a temperature sensor can be fabricated using an abrupt MIT device that undergoes an abrupt MIT at the desired transition temperature.

In the present invention, suitable electrical or electronic devices are connected to the temperature sensor in order to sense a temperature equal to or higher than the transition temperature and inform a user of such an abnormal condition. Since the electrical resistance of the temperature sensor changes abruptly at the transition temperature, a voltage must be continuously applied to the abrupt MIT device through the electrode layer in order to measure the abrupt resistance change.

The temperature sensor using the abrupt MIT device according to the present invention can accurately sense temperatures equal to or higher than the transition temperature of the abrupt MIT device and also can be fabricated cheaply in a very small size.

However, the transition temperature of such an abrupt MIT device is predetermined according to the materials and structures of its components, and a temperature sensor using the abrupt MIT device can sense only temperatures equal to or higher than the transition temperature. What is therefore required is an abrupt MIT device with a variable transition temperature. Hereinafter, the abrupt MIT device with variable transition temperatures will be described in detail. The abrupt MIT device has been developed on the basis of the hole-driven MIT theory that has been disclosed in 'Physics C 341-348 (2000) 729; http://xxx.lanl.gov/abs/cond-mat/0110112; New J. Phys. 6 (2004) 52'.

Figure 5:
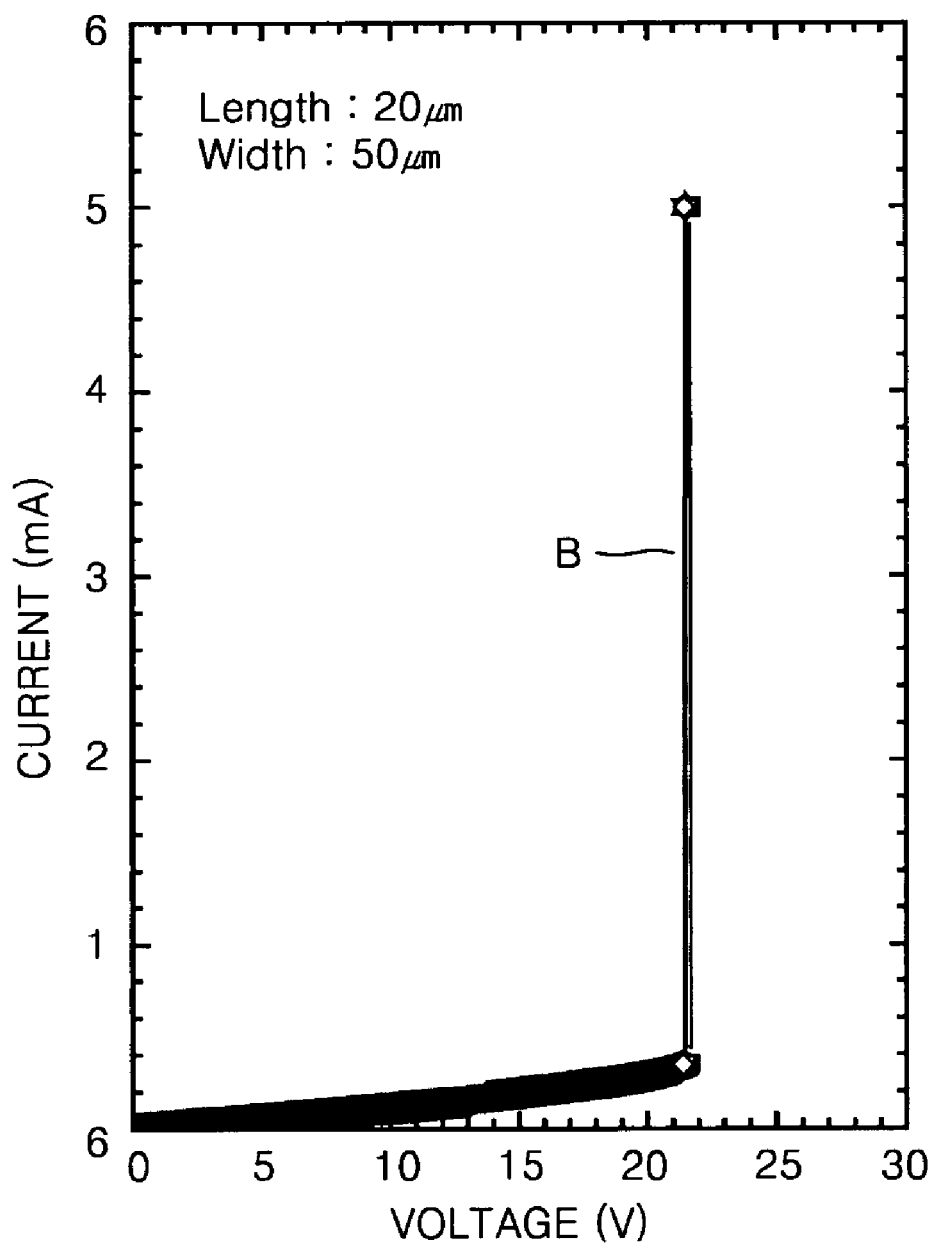
FIG. 5 is a voltage-current graph of the abrupt MIT device of FIG. 4, which undergoes an abrupt current jump at a specific voltage.

FIG. 5 is a voltage-current graph of the abrupt MIT device of FIG. 4, which undergoes an abrupt current jump at a specific voltage (i.e. a transition voltage). This abrupt MIT device is a planar type, where the abrupt MIT layer is formed of $VO_2$ and the distance d and the width w are respectively 20 μm and 50 μm. Referring to FIG. 5, since an abrupt MIT (B) occurs at a voltage of 21.5 V, the abrupt MIT device can be regarded as having a transition voltage of about 21.5 V.

Figure 6:
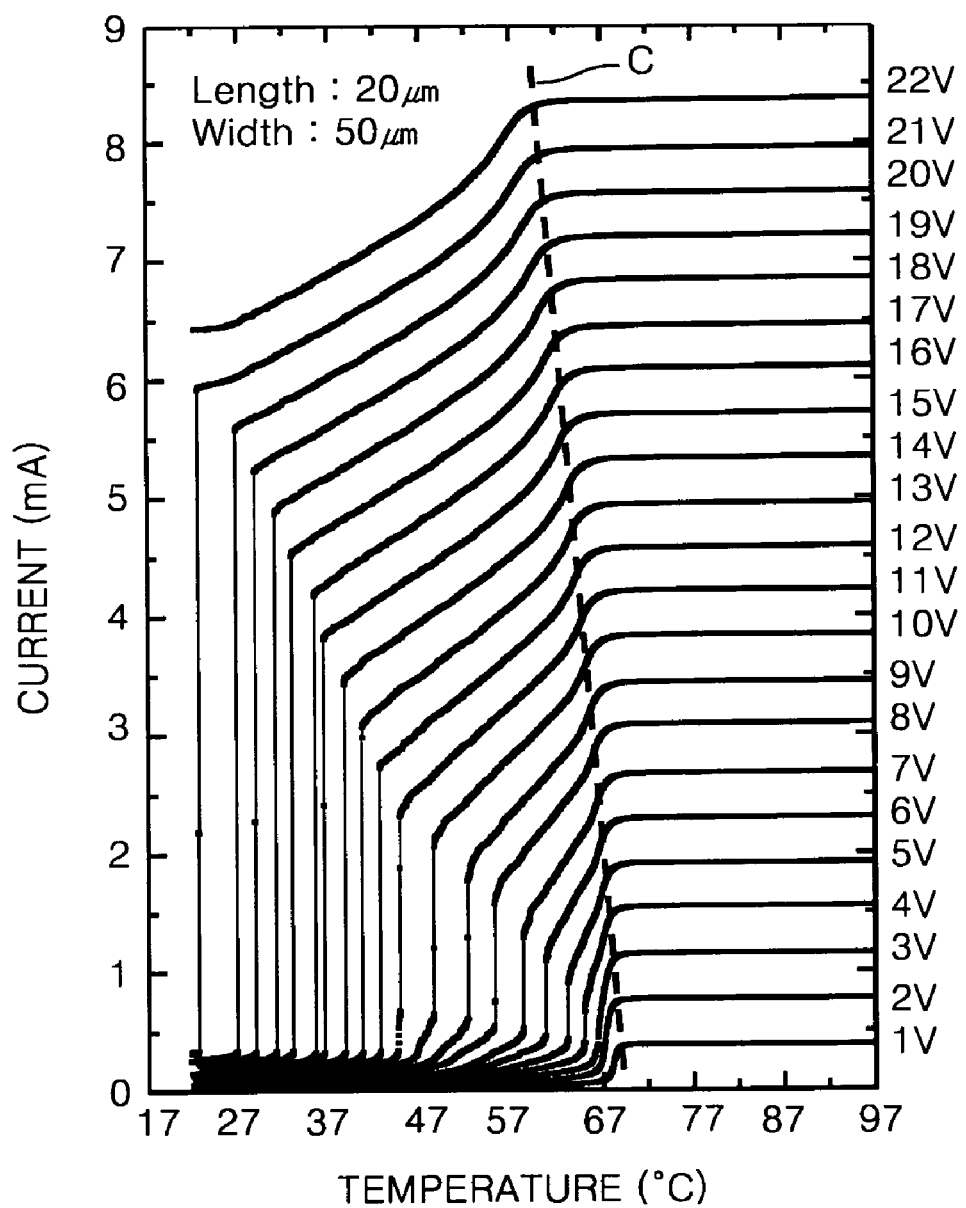
FIG. 6 is a graph illustrating the temperature dependence of current measured while applying various voltages to the abrupt MIT device of FIG. 4. The transition MIT temperature is controlled by applying voltage. This is programmable.

FIG. 6 is a graph illustrating the temperature dependence of current measured while applying various voltages to the same abrupt MIT device.

FIG. 6 illustrates a typical current curve of $VO_2$ when a voltage of 1 V is applied to the abrupt MIT device, which corresponds to the temperature-resistance graph of FIG. 4. It can also be seen from the graph of FIG. 6 that the transition temperature of the abrupt MIT device decreases as the applied voltage increases; this is programmable. As the applied voltage approaches the transition voltage (i.e. 21.5 V) of the abrupt MIT device, the transition temperature approaches room temperature. When a voltage of 22V is applied to the abrupt MIT device, the current curve follows Ohm's Law and does not exhibit a transition temperature. That is, when a voltage higher than the transition voltage is applied to the abrupt MIT device, only a voltage-dependent abrupt MIT occurs, and thus no temperature-dependent abrupt MIT occurs.

Ohm's Law and the corresponding current change can be detected after a current jump at a transition temperature for each applied voltage. At about 68° C. (line C), the current change decreases slightly as the applied voltage increases, which means that the structure of $VO_2$ is changed from the rhombic system to the tetragonal system. That is, the $VO_2$ undergoes a structural phase transition from rhombic to tetragonal and thus its electrical resistance changes due to the corresponding MIT. In conclusion, the graph of FIG. 6 reveals that the abrupt MIT occurring at the transition temperature at each voltage has no relation to the structural phase transition depending on the critical temperature.

The present invention makes it possible to vary the transition temperature of the abrupt MIT device by changing a voltage applied to the abrupt MIT device. The use of the abrupt MIT device with variable transition temperatures makes it possible to fabricate a temperature sensor whose sensing temperature can be adjusted to a desired temperature. The abrupt MIT device allows the fabrication of a small, cheap temperature sensor with variable sensing temperature.

A variable resistor may be connected in series with the abrupt MIT device in order to easily change the voltage applied to the abrupt MIT device. When the abrupt MIT device is used for a temperature sensor, the heat generated in the abrupt MIT layer must be rapidly dissipated in order to sense temperature accurately. To this end, the abrupt MIT device may include a heat sink at an outer portion of the abrupt MIT device, connected to the abrupt MIT layer.

When the transition voltage changes due to a change in the material or structure of the components of the abrupt MIT device, it is apparent that the variable range of the transition temperature can vary with the applied voltage. The voltage applied to the abrupt MIT device can be interpreted as an electric field or an electromagnetic wave.

Figure 7:
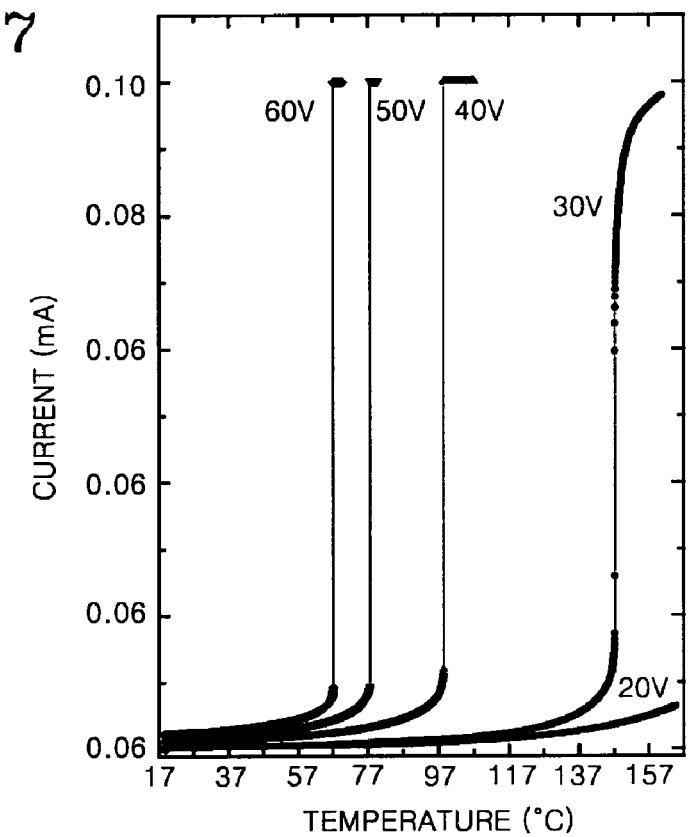
FIG. 7 is a graph illustrating the temperature dependence of current measured while applying various voltages to an abrupt MIT device that is fabricated using gallium arsenide (GaAs) doped with low-concentration holes.

FIG. 7 is a graph illustrating the temperature dependence of current measured while applying various voltages to an abrupt MIT device that is fabricated using gallium arsenide (GaAs) doped with low-concentration holes.

It is generally known that a GaAs semiconductor has no critical temperature, and does not undergo any structural phase transition. However, it can be seen from the graph of FIG. 7 that an abrupt MIT can occur in the abrupt MIT device fabricated using a GaAs semiconductor doped with low-concentration holes, and that the transition temperature can vary with the applied voltage.

In conclusion, a variety of semiconductor materials as well as $VO_2$ can be used to fabricate an abrupt MIT device with variable transition temperature for a temperature sensor with variable sensing temperature.

Figure 8:
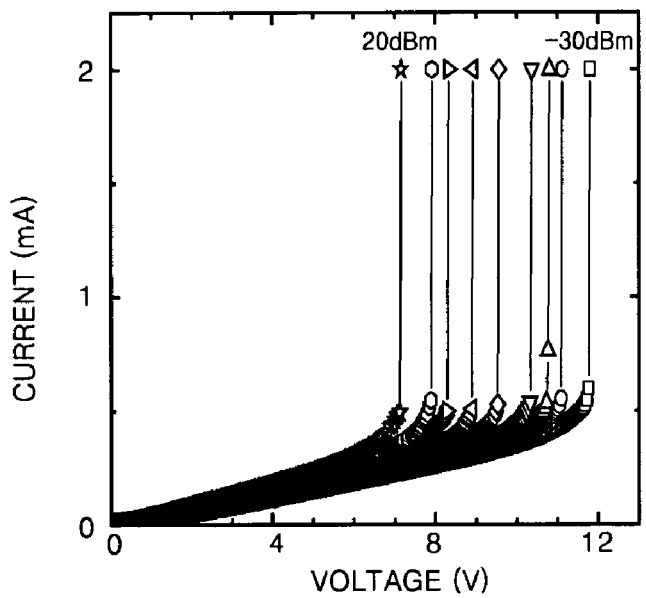
FIG. 8 is a voltage-current graph illustrating that the transition voltage of an abrupt MIT device changes with the strength of an electromagnetic wave irradiated onto an abrupt MIT layer of the abrupt MIT device.

FIG. 8 is a voltage-current graph illustrating that the transition voltage of an abrupt MIT device changes with the intensity of an electromagnetic wave irradiated onto an abrupt MIT layer of the abrupt MIT device. The electromagnetic wave used for FIG. 8 had a wavelength of 1.55 μm.

Referring to FIG. 8, it can be seen that the transition voltage decreases as the optical power of the irradiated electromagnetic wave increases. For example, it can be seen that the transition voltage decreases from about 12 V to about 7 V as the optical power of the irradiated electromagnetic wave increases from −30 dBm to 20 dBm. This shows that the irradiated electromagnetic wave can be used to vary the transition voltage of the abrupt MIT device. Similarly, rays such as infrared heat rays can also be used to vary the transition voltage. Furthermore, physical and chemical actions of, for example, pressure, a magnetic field, and chemical gas concentration can be used to vary the abrupt MIT characteristics (e.g. the transition temperature and the transition voltage) of the abrupt MIT device. Examples of the chemical gas are oxygen gas, carbon gas, hydrogen gas, sulfur gas, and chlorine gas.

The above results can be used to sense an electromagnetic wave. That is, the power of an electromagnetic wave can be sensed by measuring the voltage at which the current in the abrupt MIT device jumps abruptly. Therefore, the abrupt MIT device can be used in a variety of electromagnetic-wave sensors such as temperature sensors, infrared sensors, image sensors, and switches. The abrupt MIT device can also be used in pressure sensors and chemical-gas-concentration sensors that can sense physical and chemical action.

Alarm apparatuses including a temperature sensor using an abrupt MIT device according to embodiments of the present invention will now be described.

Figure 9:
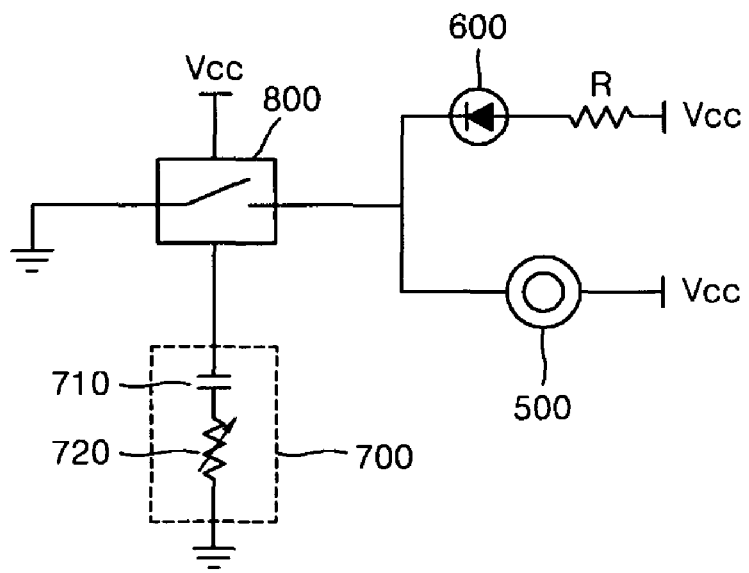
FIG. 9 is a circuit diagram of an alarm apparatus including a temperature sensor using an abrupt MIT device according to an embodiment of the present invention.

FIG. 9 is a circuit diagram of an alarm apparatus including a temperature sensor using an abrupt MIT device according to an embodiment of the present invention.

Referring to FIG. 9, the alarm apparatus includes a temperature sensor 700, a relay switch 800, a buzzer 500, and a light-emitting diode 600. The relay switch 800 is connected to the temperature sensor 700. The buzzer 500 and the light-emitting diode 600 are connected to the relay switch 800. A source voltage Vcc is applied to the relay switch 800, the buzzer 500 and the light-emitting diode 600.

The temperature sensor 700 includes an abrupt MIT device 710 and a variable resistor 720. The abrupt MIT device 710 undergoes an abrupt MIT at a transition temperature. The variable resistor 720 serves to vary a voltage applied to the abrupt MIT device 710, to vary the transition temperature of the abrupt MIT device 710 and thus adjust the sensing temperature of the temperature sensor 700.

The buzzer 500 and the light-emitting diode 600 serve as an alarm-signaling unit for signaling that the external temperature is equal to or greater than a sensing temperature of the temperature sensor 700. That is, when the external temperature is equal to or higher than the sensing temperature, the buzzer 500 generates sound and the light-emitting diode 600 emits light. The buzzer 500 and the light-emitting diode 600 are merely examples of the alarm-signaling unit, and a variety of electrical or electronics devices capable of generating an electric signal, light or sound can be used as the alarm-signaling unit. Unlike the illustration of FIG. 9, only one of the buzzer 500 and the light-emitting diode 600 may be used as the alarm-signaling unit.

As illustrated in FIG. 9, the light-emitting diode 600 may include a diode-protecting resistor R connected in series with the light-emitting diode 600. In FIG. 9, the alarm-signaling unit is illustrated as being located close to the temperature sensor 700. However, the alarm-signaling unit may be installed in a remote control station and then connected by wires to the temperature sensor 700. It will be apparent that the temperature sensor 700 may be installed in any place whose temperature change is to be measured.

When the external temperature is equal to or greater than the sensing temperature (i.e. the transition temperature), the abrupt MIT device 710 of the temperature sensor 700 undergoes an abrupt MIT and thus its current increases abruptly. The increased current turns on the relay switch 800 to energize the buzzer 500 and the light-emitting diode 600, thereby generating sound and light signals.

The temperature sensor 700 uses only one abrupt MIT device, unlike the conventional sensor unit including the several circuit components (see FIG. 1). Accordingly, the alarm apparatus of the present invention can be fabricated very simply. In addition, since the sensing temperature of the temperature sensor 700 can be easily changed using the variable resistor, the sensing apparatus can be designed to operate at a desired sensing temperature. Furthermore, since the temperature sensor 700 can be fabricated cheaply in a small size, the alarm apparatus can also be fabricated cheaply in a small size.

Figure 10:
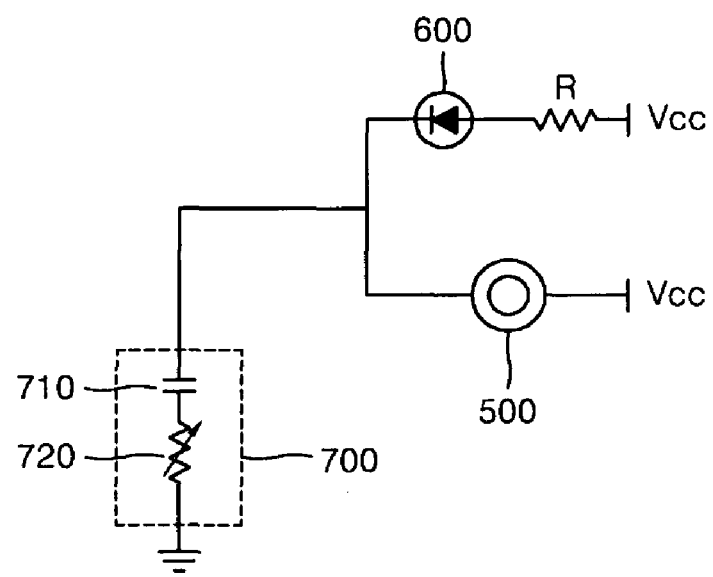
FIG. 10 is a circuit diagram of an alarm apparatus including a temperature sensor using an abrupt MIT device according to another embodiment of the present invention.

FIG. 10 is a circuit diagram of an alarm apparatus including a temperature sensor using an abrupt MIT device according to another embodiment of the present invention.

Unlike the alarm apparatus of FIG. 8, the alarm apparatus of FIG. 10 does not use the relay switch 800 and the source voltage Vcc.

Referring to FIG. 10, an abrupt MIT device 710 of a temperature sensor 700 undergoes an abrupt MIT at a sensing temperature (i.e. a transition temperature), thereby passing more current. Accordingly, corresponding currents flow respectively through a buzzer 500 and a light-emitting diode 600, thereby generating sound and light signals. Although a small current flows at temperatures below the transition temperature, such a small current is too weak to operate the buzzer 500. In addition, since most of the voltage is applied across the temperature sensor 700, the voltage across the light-emitting diode 600 is too weak to operate the light-emitting diode 600.

As in the embodiment of FIG. 8, not only the buzzer 500 and the light-emitting diode 600 but also a variety of electric or electronic devices capable of generating a variety of electric signals, light, or sound may be used as the alarm-signaling unit. In addition, only one of the buzzer 500 and the light-emitting diode 600 may be used, and the alarm-signaling unit and the alarm-signaling unit may be installed in a remote control station.

As described above, this embodiment does not even need a relay switch. Accordingly, it is possible to further simplify the internal circuit of the alarm-signaling unit and thus to fabricate a smaller and cheaper alarm-signaling unit.

Figure 11:
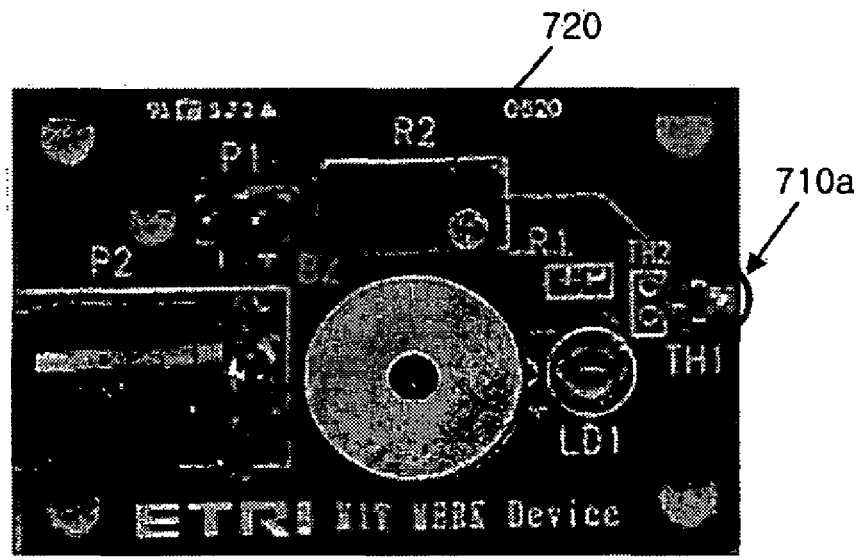
FIG. 11 is a picture of an alarm apparatus fabricated using a DIP-type abrupt MIT device.

FIG. 11 is a picture of an alarm apparatus using a dual in-line package (DIP)-type abrupt MIT device, which uses the circuit of FIG. 10.

Referring to FIG. 11, reference numerals 710a and 720 respectively denote a DIP-type abrupt MIT device and a variable resistor 720. The 'DIP-type' means that the abrupt MIT device is hermetically sealed using a sealant such as an epoxy, like a general semiconductor chip.

Figure 12:
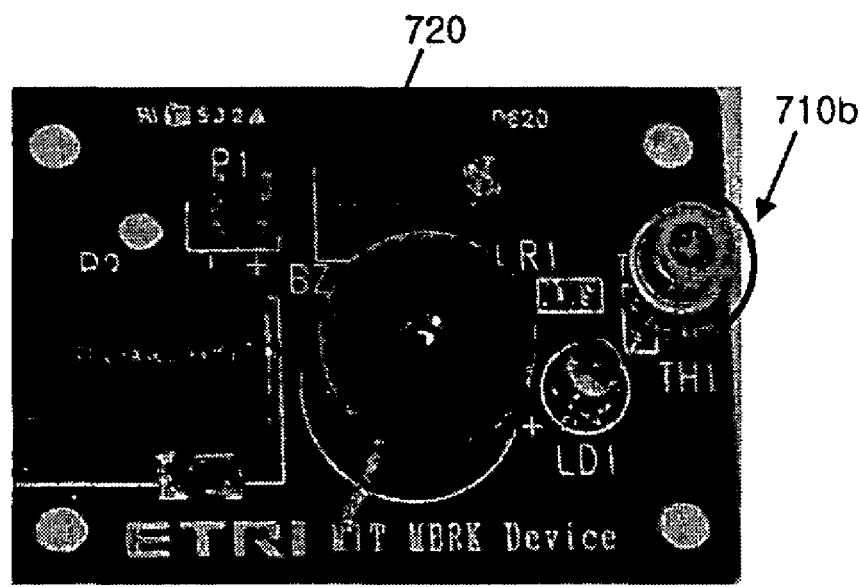
FIG. 12 is a picture of an alarm apparatus fabricated using a CAN-type abrupt MIT device.

FIG. 12 is a picture of an alarm apparatus using a CAN-type abrupt MIT device, which uses the circuit of FIG. 10.

Referring to FIG. 12, reference numerals 710b and 720 respectively denote a CAN-type abrupt MIT device and a variable resistor 720. The 'CAN-type' means that the top surface of the abrupt MIT device is open, exposing a portion of the abrupt MIT layer. Since electromagnetic waves can be irradiated through the opening portion, the CAN-type abrupt MIT device can be conveniently used in electromagnetic-wave sensors such as infrared detectors. A lens may be formed at the opening portion of the top surface of the CAN-type abrupt MIT device. The lens condenses light onto the abrupt MIT layer and prevents the abrupt MIT device from being contaminated.

Figure 13:
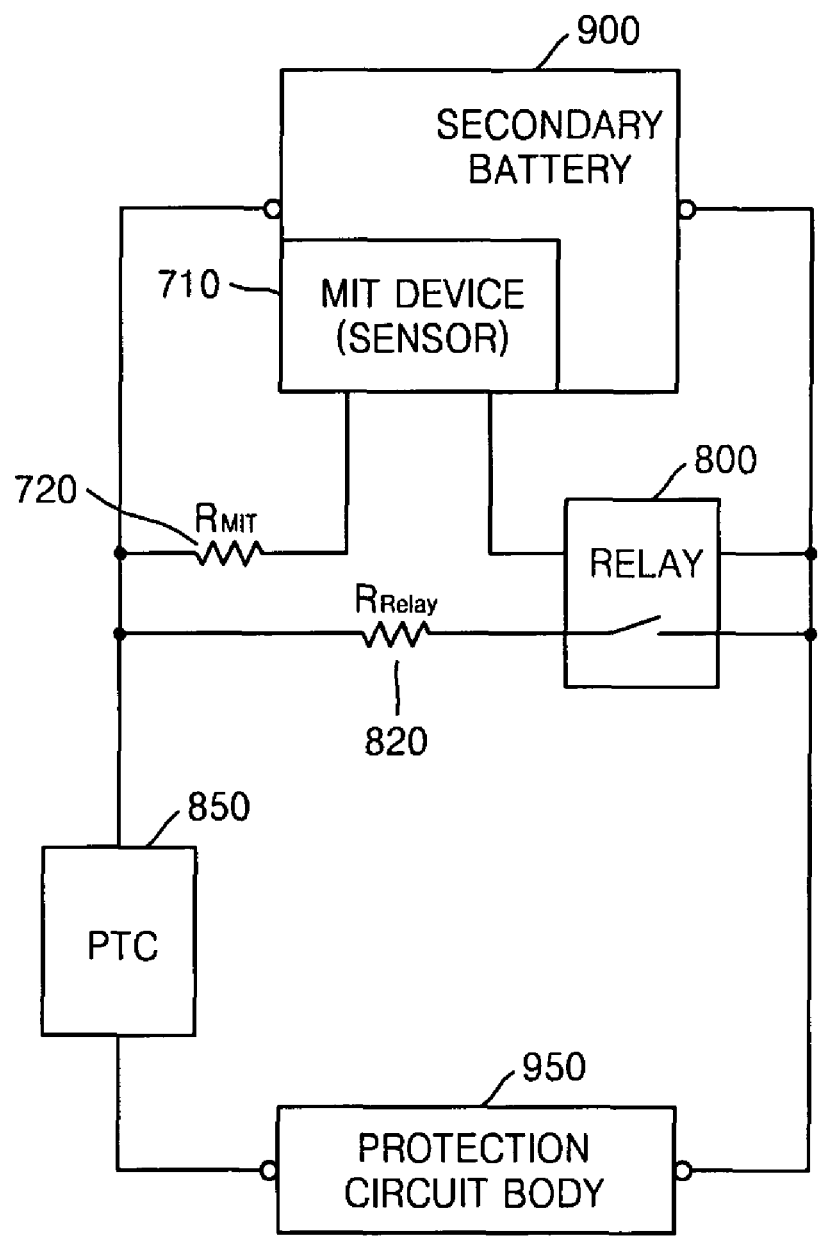
FIG. 13 is a circuit diagram of a secondary battery anti-explosion circuit using an abrupt MIT device according to an embodiment of the present invention.

FIG. 13 is a circuit diagram of a secondary battery anti-explosion circuit using an abrupt MIT device according to an embodiment of the present invention.

Referring to FIG. 13, the secondary battery anti-explosion circuit includes a secondary battery 900, an MIT sensor 710, and a protection circuit body 950 powered by the secondary battery 900. The MIT sensor 710 is attached to the secondary battery 900 to sense the temperature of the secondary battery 900, thereby preventing the possible explosion of the secondary battery 900. The secondary battery 900 may be a rechargeable battery such as a lithium-ion secondary battery. The MIT sensor 710 may be a temperature sensor capable of sensing the temperature of the secondary battery 900 to prevent the secondary battery 900 from exploding due to a temperature rise.

One terminal of the secondary battery 900 is connected to a first electrode layer of an abrupt MIT device of the MIT sensor 710, to a first terminal of a 4-terminal relay switch 800, and to one terminal of the protection circuit body 950. The other terminal of the secondary battery 900 is connected to second and third terminals of the relay switch 800 and to the other terminal of the protection circuit body 950. A second electrode layer of the abrupt MIT device is connected to a fourth terminal of the relay switch 800. When the abrupt MIT device undergoes an abrupt MIT due to a temperature rise in the secondary battery 900, an abrupt current change occurs between the third and fourth terminals of the relay switch 800. The first and second terminals of the relay switch 800 are turned on by the abrupt current change, thereby preventing the possible explosion of the secondary battery 900.

As illustrated in FIG. 13, to change the transition temperature of the abrupt MIT device or protect the abrupt MIT device, a variable resistor 720 may be connected between one terminal of the secondary battery 900 and the first electrode layer of the abrupt MIT device. To prevent an electrical short, a relay resistor 820 may be connected between one terminal of the secondary battery 900 and the first terminal of the relay switch 800. To protect the protection circuit body 950, an overcurrent prevention device 850 (e.g. a positive temperature coefficient thermistor (PTC)) may be connected between one terminal of the secondary battery 900 and one terminal of the protection circuit body 950. The relay resistor 820 may have a resistance of several $\Omega$, and the variable resistor 720 may have a higher resistance than the relay resistor 820.

Figure 14:
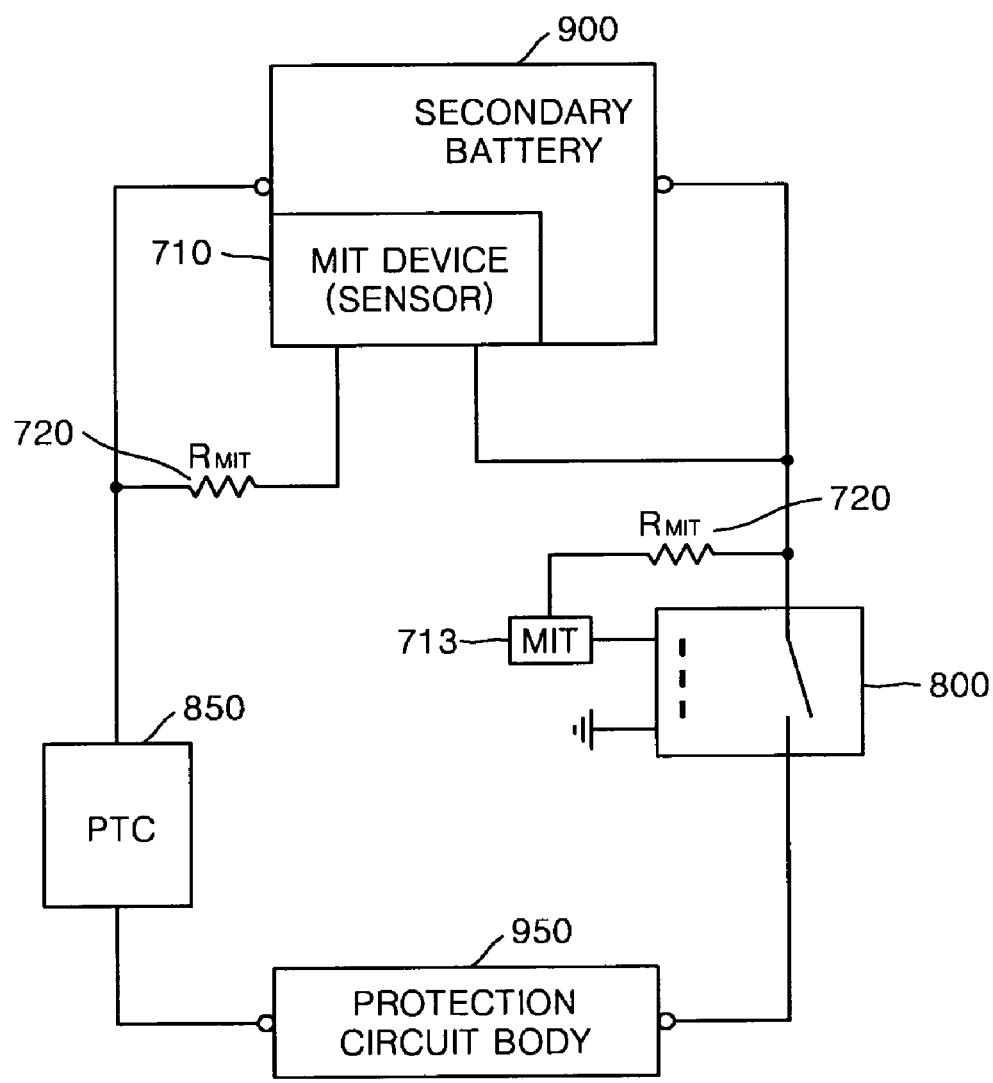
FIG. 14 is a circuit diagram illustrating a modification of the secondary battery anti-explosion circuit illustrated in FIG. 13.

FIG. 14 is a circuit diagram illustrating a modification of the secondary battery anti-explosion circuit illustrated in FIG. 13.

Referring to FIG. 14, a relay switch 800 is connected in series between a secondary battery 900 and a protection circuit body 950. In normal operation, the relay switch 800 connects the secondary battery 900 and the protection circuit body 950. When the temperature of the secondary battery 900 increases to a predetermined level during the charge/discharge operation of the secondary battery 900, an MIT sensor 713 attached to the secondary battery 900 operates to short the relay switch 800, and another MIT sensor 710 of the secondary battery 900 operates to discharge the secondary battery 900, thereby preventing the possible explosion of the secondary battery 900. Thereafter, when the temperature of the secondary battery 900 falls below the predetermined level, the relay switch 800 operates normally. Although the MIT sensor 713 is illustrated as being separate from the secondary battery 900, not only the MIT sensor 710 but also the MIT sensor 713 is attached to the secondary battery 900.

Figure 15:
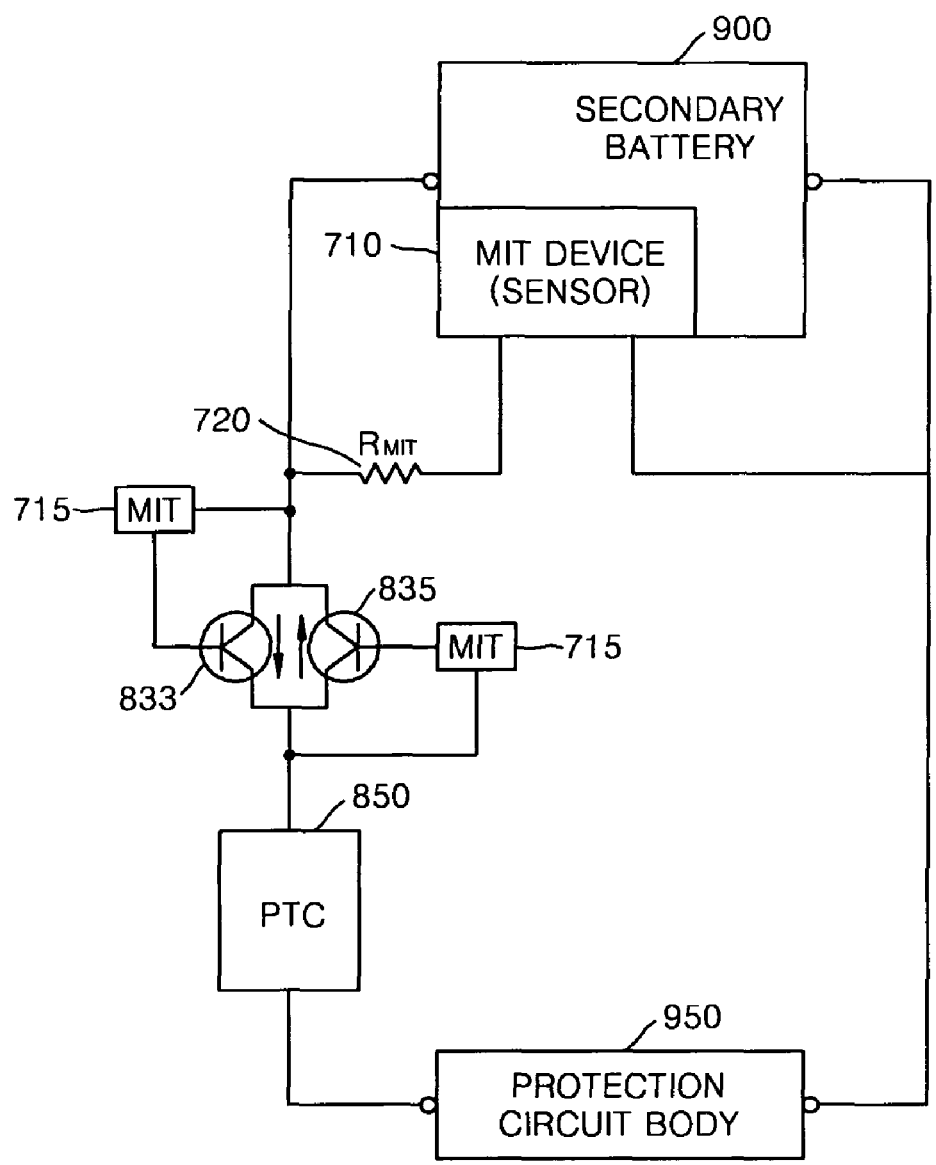
FIG. 15 is a circuit diagram illustrating another modification of the secondary battery anti-explosion circuit illustrated in FIG. 13.

FIG. 15 is a circuit diagram illustrating another modification of the secondary battery anti-explosion circuit illustrated in FIG. 13.

Referring to FIG. 15, the secondary battery anti-explosion circuit of FIG. 15 operates on the same principle as the secondary battery anti-explosion circuit of FIG. 14, but uses transistors instead of the relay switch 800 of FIG. 14. As in the secondary battery anti-explosion circuit of FIG. 14, MIT sensors 710 and 715 are also attached to a secondary battery 900. Since the current direction varies between the charge and discharge operations of the secondary battery 900, a charge transistor 835 and a discharge transistor 835 are used respectively for the charge operation and the discharge operation. In the charge operation, a current flows through the charge transistor 835 because the MIT sensor 715 attached to the secondary battery 900 does not undergo an abrupt MIT. When heat is emitted from the secondary battery 900 during the charge operation, the MIT sensor 715 operates to interrupt a conduction current of the charge transistor 835. Then, the MIT sensor 710 operates to discharge the secondary battery 900, thereby preventing the possible explosion of the secondary battery 900. In the discharge operation, the discharge transistor 835 operates normally. When heat is generated in the secondary battery 900 during the discharge operation, the MIT sensor 715 operates to interrupt a conduction current of the discharge transistor 835. Then, the MIT sensor 710 operates to discharge the secondary battery 900, thereby preventing the possible explosion of the secondary battery 900. When a current flows through a gate terminal, the transistor 835 interrupts a current between the other two terminals. When no current flows through the gate terminal, the transistor 835 allows a current to flow between the other two terminals.

In the secondary battery anti-explosion circuit of the present embodiment, a large current of the secondary battery flows through the relay switch at a transition temperature (e.g. 68° C.) or more, resulting in the discharge operation. Accordingly, the internal voltage of the secondary battery is dropped to prevent the possible explosion of the secondary battery. Therefore, the secondary battery anti-explosion circuit of the present embodiment can be conveniently used in any electric, electronic or mechanical devices using a secondary battery, such as cellular phones, notebook computers, and automobiles.

Examples of an external factor causing the abrupt MIT are temperature, electromagnetic waves (e.g. infrared rays), pressure, magnetic fields, and chemical gas including oxygen, carbon, hydrogen, nitrogen, chlorine, and sulfur. Therefore, the MIT sensors according to the embodiments of the present invention can be utilized for various purposes in various industrial fields. For example, by connecting abrupt MIT devices in parallel and/or in series or by arranging them in an array or matrix configuration, the MIT sensor can be used as an image sensor that can sense electromagnetic waves to transmit image signals.

While the present invention has been particularly shown and described with reference to exemplary embodiments thereof, it will be understood by those of ordinary skill in the art that various changes in form and detail may be made therein without departing from the spirit and scope of the present invention as defined by the following claims.

MODE FOR INVENTION

Industrial Applicability

The present invention relates to a sensor and an alarm apparatus particularly, to an abrupt metal-insulator transition (MIT) device, an MIT sensor using the abrupt MIT device, and an alarm apparatus and a secondary battery anti-explosion circuit including the MIT sensor. The abrupt MIT devices of the present invention can be used to implement a variety of sensors such as temperature sensors, magnetic-field sensors, image sensors, electromagnetic-wave sensors, pressure sensors, and gas-concentration sensors. Also, the MIT sensor of the present invention can be attached to a secondary battery to implement the secondary battery anti-explosion circuit and prevent the secondary battery from exploding due to an excessive temperature rise.

The invention claimed is:

1. An abrupt MIT (metal-insulator transition) device comprising:
    an abrupt MIT layer undergoing an abrupt MIT at a transition temperature or a transition voltage; and
    at least two electrode layers contacting the abrupt MIT layer,
    wherein the transition temperature or the transition voltage varies with at least one of factors including a voltage applied to the electrode layers, a temperature, an electromagnetic wave, a pressure, and a gas concentration, that affect the abrupt MIT layer.

2. The abrupt MIT device of claim 1, wherein the two electrode layers are vertically stacked with the abrupt MIT layer interposed therebetween, or the two electrode layers are formed on both ends of the abrupt MIT layer respectively.

3. The abrupt MIT device of claim 1, wherein the abrupt MIT layer is formed of at least one of an inorganic compound semiconductor or insulator material to which low-concentration holes are added, an organic semiconductor or insulator material to which low-concentration holes are added, a semiconductor material to which low-concentration holes are added, and an oxide semiconductor or insulator material to which low-concentration holes are added, the inorganic compound semiconductor or insulator material, the organic semiconductor or insulator material, the semiconductor material, and the oxide semiconductor or insulator material including at least one of oxygen, carbon, a semiconductor element (e.g. a group III-V compound or a group II-VI compound), a transition metal element, a rare earth element, and a lanthanum-based element.

4. The abrupt MIT device of claim 3, wherein the abrupt MIT layer is formed of vanadium dioxide ($VO_2$) or gallium arsenide (GaAs) doped with low-concentration holes.

5. The abrupt MIT device of claim 1, wherein the electromagnetic wave includes infrared rays, and the transition temperature or the transition voltage is varied by irradiation of the electromagnetic wave onto the abrupt MIT layer.

6. The abrupt MIT device of claim 1, wherein the abrupt MIT device is used in at least one of a temperature sensor, an infrared sensor, an image sensor, a pressure sensor, a gas-concentration sensor, and a switch.

7. An MIT sensor fabricated using the abrupt MIT device of claim 1.

8. The MIT sensor of claim 7, wherein the MIT sensor is at least one of a temperature sensor, an electromagnetic wave detector, an infrared sensor, an image sensor, a pressure sensor, a gas-concentration sensor, a particle detector (electron, ion, cosmic ray), and a switch.

9. The MIT sensor of claim 7, wherein the abrupt MIT device is connected in parallel and/or in series with like devices (arrayed sensor) or the abrupt MIT device is arranged in an array or matrix configuration with like devices (arrayed sensor).

10. The MIT sensor of claim 7, wherein the abrupt MIT layer and the electrode layers are hermetically sealed with sealant to form a DIP-type abrupt MIT device, a CAN-Type abrupt MIT device, or a portion of the abrupt MIT layer is opened to form a CAN-type abrupt MIT device.

11. The MIT sensor of claim 10, wherein the abrupt MIT device is fabricated as the CAN type and a lens is formed at an opening portion of the CAN-type abrupt MIT device to condense electromagnetic waves onto the abrupt MIT layer.

12. The MIT sensor of claim 11, wherein the electromagnetic waves are irradiated onto the abrupt MIT layer to vary the transition temperature or the transition voltage of the abrupt MIT device.

13. The MIT sensor of claim 7, wherein the MIT sensor is electrically connected to an alarm-signaling unit directly or through a relay switch, to sense at least one of a temperature, a pressure, a gas concentration, and an electromagnetic wave strength, and
    an alarm signal is generated by the alarm-signaling unit when the sensed value is equal to or greater than a reference value.

14. The MIT sensor of claim 13, wherein the gas concentration is a concentration of gas including at least one of oxygen, carbon, hydrogen, nitrogen, chlorine, and sulfur.

15. The MIT sensor of claim 7, further comprising a heat sink dissipating the heat of the abrupt MIT layer outside.

16. The MIT sensor of claim 7, further comprising a variable resistor connected in series with the abrupt MIT device to adjust a voltage applied to the abrupt MIT device.

17. An alarm apparatus comprising:
    the MIT sensor of claim 7; and
    an alarm-signaling unit connected in series with the MIT sensor.

18. The alarm apparatus of claim 17, wherein the MIT sensor is at least one of a temperature sensor, an electromagnetic wave detector, an infrared sensor, an image sensor, a pressure sensor, a gas-concentration sensor, a particle detector, and a switch.

19. The alarm apparatus of claim 17, wherein the abrupt MIT device is connected in parallel and/or in series with like devices or the abrupt MIT device is arranged in an array or matrix configuration with like devices.

20. The alarm apparatus of claim 19, wherein the MIT sensor senses an electromagnetic wave including infrared rays through the array or matrix configuration to send an alarm signal including an image signal to the alarm-signaling unit.

21. A secondary battery anti-explosion circuit comprising;
    a secondary battery;
    the MIT sensor of claim 7, attached to the secondary battery to sense the temperature of the secondary battery and thus prevent the possible explosion of the secondary battery; and
    a protection circuit body powered by the secondary battery.

22. The secondary battery anti-explosion circuit of claim 21, wherein one terminal of the secondary battery is connected to the first electrode layer of the abrupt MIT device of the MIT sensor, to a first terminal of a 4-terminal relay switch, and to one terminal of the protection circuit body,
    the other terminal of the secondary battery is connected to second and third terminals of the relay switch and to the other terminal of the protection circuit body,
    the second electrode layer of the abrupt MIT device is connected to a fourth terminal of the relay switch, and
    the abrupt MIT device undergoes an abrupt MIT due to a temperature rise in the secondary battery, an abrupt current change occurs between the third and fourth terminals of the relay switch in order to control relay switch, and the first and second terminals of the relay switch are turned on by the abrupt current change to prevent the possible explosion of the secondary battery.

23. The secondary battery anti-explosion circuit of claim 22, wherein a variable resistor is connected between one terminal of the secondary battery and the first
electrode layer of the abrupt MIT device to change the transition temperature of the abrupt MIT device or to protect the abrupt MIT device, and
a relay resistor is connected between one terminal of the secondary battery and the first terminal of the relay switch to prevent an electrical short of the secondary battery anti-explosion circuit.

24. The secondary battery anti-explosion circuit of claim 21, wherein the MIT sensor includes a first MIT sensor and a second MIT sensor,
one terminal of the secondary battery is connected to one terminal of the first MIT sensor, the other terminal of the first MIT sensor is connected to the other terminal of the secondary battery, a 4-terminal relay switch is connected in series between the secondary battery and the protection circuit body, one terminal of the second MIT sensor controlling the relay switch is connected to the other terminal of the secondary battery and a first terminal of the relay switch, the other terminal of the second MIT sensor is connected to a second terminal of the relay switch that is a control input terminal, a third terminal of the relay switch is connected to a ground point, and a fourth terminal of the relay switch is connected to the protection circuit body, and
in the case of a temperature rise in the secondary battery, the second MIT sensor operates to interrupt a current flowing through the relay switch, and simultaneously the first MIT sensor operates to discharge the secondary battery, to prevent the possible explosion of the secondary battery.

25. The secondary battery anti-explosion circuit of claim 21, wherein the MIT sensor includes a first MIT sensor, a second MIT sensor, and a third MIT sensor,
one terminal of the secondary battery is connected to one terminal of the first MIT sensor, the other terminal of the first MIT sensor is connected to the other terminal of the secondary battery, two parallel transistors are connected between one terminal of the secondary battery and the protection circuit body, the second MIT sensor is connected between the secondary battery and a gate terminal of the first transistor of the two parallel transistors for an discharge operation, and the third MIT sensor is connected between the protection circuit body and a gate terminal of the second transistor of the two parallel transistors for an charge operation, and
in the case of a temperature rise in the secondary battery, the second MIT sensor and the third MIT sensor operate to interrupt a current flowing through the transistor, and simultaneously the first MIT sensor operates to discharge the secondary battery, to prevent the possible explosion of the secondary battery.

26. The secondary battery anti-explosion circuit of claim 22, wherein the MIT sensor includes a first MIT sensor, a second MIT sensor, and a third MIT sensor, one terminal of the secondary battery is connected to one terminal of the first MIT sensor, the other terminal of the first MIT sensor is connected to the other terminal of the secondary battery, two parallel transistors are connected between one terminal of the secondary battery and the protection circuit body, the second MIT sensor is connected between the secondary battery and a gate terminal of the first transistor of the two parallel transistors for an discharge operation, and the third MIT sensor is connected between the protection circuit body and a gate terminal of the second transistor of the two parallel transistors for an charge operation, and
in the case of a temperature rise in the secondary battery, the second MIT sensor and the third MIT sensor operate to interrupt a current flowing through the transistor, and simultaneously the first MIT sensor operates to discharge the secondary battery, to prevent the possible explosion of the secondary battery.

* * * * *